United States Patent
Hsu et al.

(10) Patent No.: US 11,342,496 B2
(45) Date of Patent: May 24, 2022

(54) SEMICONDUCTOR MEMORY STRUCTURE WITH MAGNETIC TUNNELING JUNCTION STACK AND METHOD FOR FORMING THE SAME

(71) Applicant: HeFeChip Corporation Limited, Sai Ying Pun (HK)

(72) Inventors: Hong-Hui Hsu, Tarrytown, NY (US); Wei-Chuan Chen, Scarsdale, NY (US); Qinli Ma, Mt Kisco, NY (US); Shu-Jen Han, Armonk, NY (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 205 days.

(21) Appl. No.: 16/861,224

(22) Filed: Apr. 29, 2020

(65) Prior Publication Data
US 2021/0343930 A1  Nov. 4, 2021

(51) Int. Cl.
| | |
|---|---|
| *H01L 43/02* | (2006.01) |
| *G11C 11/16* | (2006.01) |
| *H01F 10/32* | (2006.01) |
| *H01L 27/22* | (2006.01) |
| *H01L 43/12* | (2006.01) |
| *H01F 41/32* | (2006.01) |
| *H01L 43/10* | (2006.01) |

(52) U.S. Cl.
CPC .......... *H01L 43/02* (2013.01); *G11C 11/161* (2013.01); *H01F 10/3254* (2013.01); *H01F 10/3286* (2013.01); *H01F 41/32* (2013.01); *H01L 27/228* (2013.01); *H01L 43/10* (2013.01); *H01L 43/12* (2013.01)

(58) Field of Classification Search
CPC ....... H01L 43/02; H01L 27/228; H01L 43/10; H01L 43/12; G11C 11/161; H01F 41/32; H01F 10/3254; H01F 10/3286
USPC ........................................................ 257/421
See application file for complete search history.

(56) References Cited

U.S. PATENT DOCUMENTS

| | | | | |
|---|---|---|---|---|
| 7,880,220 B2* | 2/2011 | Choi | ...................... | H01L 29/513 257/325 |
| 2002/0097493 A1* | 7/2002 | Li | .......................... | G02B 1/115 359/589 |
| 2008/0176392 A1* | 7/2008 | Gao | .................. | H01L 27/14685 438/612 |
| 2021/0343930 A1* | 11/2021 | Hsu | ........................ | H01L 43/02 |

\* cited by examiner

Primary Examiner — Jami Valentine Miller
(74) Attorney, Agent, or Firm — Winston Hsu

(57) ABSTRACT

A semiconductor memory structure includes a substrate, a magnetic tunneling junction (MTJ) stack disposed on the substrate, and an encapsulation layer surrounding the MTJ stack. The encapsulation layer comprises an outer silicon oxynitride layer with a composition of $SiO_{x1}N_{y1}$ and an inner silicon oxynitride layer with a composition of $SiO_{x2}N_{y2}$, wherein $x1/y1 > x2/y2$.

18 Claims, 14 Drawing Sheets

SEMICONDUCTOR MEMORY STRUCTURE WITH MAGNETIC TUNNELING JUNCTION STACK AND METHOD FOR FORMING THE SAME

BACKGROUND OF THE INVENTION

1. Field of the Invention

The invention relates to a semiconductor memory structure, and more particularly, to a magnetoresistive random access memory (MRAM) device and a method for forming the same.

2. Description of the Prior Art

Magnetoresistive random access memory (MRAM), based on the integration of silicon CMOS with magnetic tunneling junction (MTJ) technology, is a major emerging technology that is highly competitive with existing semiconductor memories such as SRAM, DRAM, Flash, etc. A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ stack interposed between a first conductive line and a second conductive line at each crossover location. Typically, access transistors may be disposed below the array of first conductive lines to select certain MRAM cells within the MRAM array for read or write operations.

The MRAM device may be based on a tunneling magneto-resistance (TMR) effect wherein a stack of layers has a configuration in which two ferromagnetic layers are separated by a thin non-magnetic dielectric layer. If the non-magnetic dielectric layer is thin enough (typically a few angstroms), electrons can tunnel from one ferromagnet into the other. In a MRAM device, the MTJ stack is typically formed between a bottom electrode and a top electrode. The MTJ stack may be formed by sequentially depositing a reference layer formed by two reference-pinned layers anti-ferromagnetically coupled with each other and a polarization-enhancement layer (PEL) between one reference-pinned layer and the tunnel barrier layer, a thin tunnel barrier layer, a ferromagnetic "free" layer or storage layer, and a capping layer. The storage layer is able to provide high perpendicular magnetic anisotropy (PMA), low damping, higher spin transfer torque (STT) efficiency, smaller distribution of coercivity (Hc) and/or critical voltage (Vc), and high TMR ratio. Among all PMA ferromagnet so far developed, the CoFeB ultra-thin film in contact with an oxide, e.g. MgO and a heavy metal, e.g. Ta, W, is insensitively used as free layer. To improve the thermal stability, thicker CoFeB with both sides in contact with MgO with an ultra-thin heavy metal inserted in was employed as free layer.

To protect the MTJ stack from damage or contamination, a stoichiometric silicon nitride ($Si_3N_4$) layer is typically used as an encapsulation layer that seals the sidewall of the MTJ stack. However, the ability to block boron diffusion of the crystalline $Si_3N_4$ layer may not be satisfactory. Further, the nitrogen species or oxygen species used during the deposition of the encapsulation layer such as silicon oxide and silicon nitride can diffuse from sidewall of the MTJ stack and attack magnetic materials and MgO barrier layer, thereby degrading the electrical performance of the MRAM device. The degradation could be even worse with elevated temperature processes such as annealing.

SUMMARY OF THE INVENTION

It is one object to provide an improved magnetic tunneling junction (MTJ) stack with a capping layer in order to solve the above-described prior art shortcomings or problems.

It is another object to provide a method for fabricating a MTJ stack with a capping layer, which is compatible with current MRAM fabrication processes.

According to one aspect of the present disclosure, a semiconductor memory structure includes a substrate, a MTJ stack disposed on the substrate, and an encapsulation layer surrounding the MTJ stack. The encapsulation layer comprises an outer silicon oxynitride layer with a composition of $SiO_{x1}N_{y1}$ and an inner silicon oxynitride layer with a composition of $SiO_{x2}N_{y2}$, wherein $x1/y1 > x2/y2$.

According to some embodiments, the MTJ stack comprises a reference layer, a tunnel barrier layer on the reference layer, and a free layer on the tunnel barrier layer.

According to some embodiments, the reference layer is comprised of RL_PL1|AFC-spacer|RL_PL2|metal-spacer-|PEL, wherein RL_PL1 and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to some embodiments, the tunnel barrier layer comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the free layer is made of at least one of the following materials with thickness of 0 to 30 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, there is non-magnetic metal layer introduced in free layer to improve the retention, the non-magnetic metal layer comprises Ta, W, Mo, Nb, Mg, Al, C, V, Hf, Ir, Rh, Zr, Cr, Bi, or combinations thereof.

According to some embodiments, the semiconductor memory structure further comprises a capping layer on the free layer.

According to some embodiments, the capping layer comprises an amorphous layer, a light-element sink layer, and a diffusion-stop layer.

According to some embodiments, the semiconductor memory structure further comprises a hard mask layer on the capping layer.

According to some embodiments, the hard mask layer comprises Ru and functions as a top electrode.

According to some embodiments, the inner silicon oxynitride layer is in direct contact with a sidewall of the MTJ stack.

According to one aspect of the present disclosure, a method for fabricating a semiconductor memory structure is disclosed. A substrate is provided. A magnetic tunneling junction (MTJ) stack is formed on the substrate. An encapsulation layer is formed to surround the MTJ stack. The encapsulation layer comprises an outer silicon oxynitride layer with a composition of $SiO_{x1}N_{y1}$ and an inner silicon oxynitride layer with a composition of $SiO_{x2}N_{y2}$, wherein x1/y1>x2/y2.

According to some embodiments, the MTJ stack comprises a reference layer, a tunnel barrier layer on the reference layer, and a free layer on the tunnel barrier layer.

According to some embodiments, the reference layer is comprised of RL_PL1|AFC-spacer|RL_PL2|metal-spacer-|PEL, wherein RL_PL1 layer and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and RL_PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to some embodiments, the tunnel barrier layer comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the free layer is made of at least one of the following materials with thickness of 10 to 50 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, there is non-magnetic metal layer introduced in the free layer to improve the retention. The non-magnetic metal layer comprises Ta, W, Mo, Nb, Mg, Al, C, V, Hf, Ir, Rh, Zr, Cr, Bi, or combinations thereof.

According to some embodiments, the method further comprises: forming a capping layer on the free layer.

According to some embodiments, the method further comprises: forming a hard mask layer on the capping layer.

According to some embodiments, the step of forming encapsulation layer surrounding the MTJ stack comprises: depositing a silicon-rich SiN layer on a sidewall of the MTJ stack; and subjecting the silicon-rich SiN layer to a post-treatment, thereby transforming an outer portion of the encapsulation layer into the outer silicon oxynitride layer, while an inner part of the encapsulation layer is still the silicon-rich SiN layer.

According to some embodiments, a Si content of the silicon-rich SiN layer exceeds that of stoichiometric $Si_3N_4$.

According to some embodiments, the post-treatment comprises an oxygen plasma treatment.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
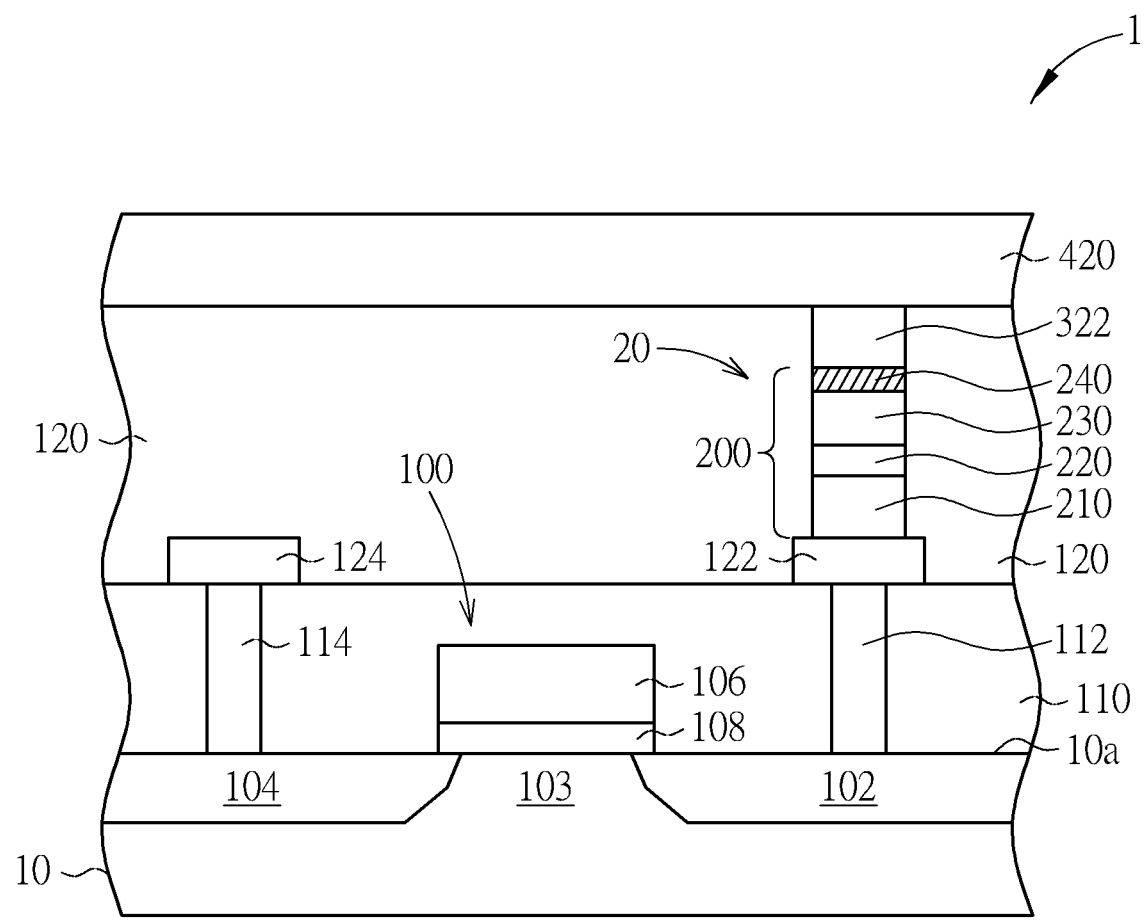
FIG. 1 is a schematic, cross-sectional diagram showing an exemplary 1T-1MTJ structure of a MRAM device according to a non-limiting embodiment of the present invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to a semiconductor memory structure suited for magnetoresistive random access memory (MRAM) device such as a spin-transfer torque magnetoresistive random access memory (STT-MRAM) device and a fabrication method thereof. STT-MRAM is a non-volatile memory, which has several advantages over the conventional magnetoresistive random access memory. For example, these advantages include higher scalability, lower-power consumption, and faster operating speed. Spin transfer torque is an effect in which the orientation of a magnetic layer in a magnetic tunnel junction or spin valve can be modified using a spin-polarized current. STT-MRAM uses electrons that become spin-polarized as the electrons pass through a thin film (spin filter). During a write operation, the spin-polarized electrons exert torque on a free layer, which switches a polarity of the free layer. During a read operation, a current detects the resistance/logic state of the MTJ stack.

The present disclosure is characterized in that the MTJ stack is surrounded by an encapsulation layer comprising a silicon oxynitride layer with a gradient oxygen concentration across the thickness of the encapsulation layer. The encapsulation layer is formed by depositing a silicon-rich SiN layer, therefore, the potential nitrogen damage to the magnetic layer and the MgO layer during the deposition of the encapsulation layer can be reduced.

FIG. 1 is a schematic, cross-sectional diagram showing an exemplary one-transistor-one-MTJ (1T-1MTJ) structure of a MRAM device 1 according to a non-limiting embodiment of the present invention. As shown in FIG. 1, the MRAM device 1 comprises a substrate 10 having a top surface 10a. For example, the substrate 10 may be a silicon substrate, a silicon-on-insulator (SOI) substrate, or any suitable semiconductor substrates known in the art.

According to one embodiment, an access transistor 100 may be formed on the top surface 10a of the substrate 10. The access transistor 100 may comprise a drain doping region 102 and a source doping region 104 spaced apart by a channel 103 from each other. The drain doping region 102 and the source doping region 104 may be formed by ion implantation process and may be formed in the substrate 10. A channel region 103 may be formed between the drain doping region 102 and the source doping region 104. A gate 106 may be formed over the channel region 103. A gate dielectric layer 108 such as a silicon oxide layer may be formed between the gate 106 and the channel region 103.

It is to be understood that the MRAM device 1 may comprise peripheral circuits for supporting the MRAM memory array. The peripheral circuits may be formed in a logic circuit area, which is not shown for the sake of simplicity.

An inter-layer dielectric (ILD) layer 110 may be deposited over the substrate 10. The ILD layer 110 covers the gate 106, the drain doping region 102, and the source doping region 104 of the access transistor 100. A contact plug 112 and a contact plug 114 may be formed directly on the drain doping region 102 and the source doping region 104, respectively, in the ILD layer 110. For example, the contact plug 112 and the contact plug 114 may comprise Cu, Ti, TiN, Ta, TaN, W, alloys or combinations thereof, but is not limited thereto. An inter-layer dielectric (ILD) layer 120 may be deposited over the ILD layer 110. Electrodes (or interconnect patterns) 122 and 124 may be formed on the ILD layer 110 for signal transmission.

According to one embodiment, an exemplary cylindrical memory stack 20 may be formed on the contact plug 112 in the ILD layer 120. The cylindrical memory stack 20 may comprise a magnetic tunneling junction (MTJ) stack 200 sandwiched by a bottom electrode 122 and a top electrode 322. The MTJ stack 200 is electrically coupled to the drain doping region 102 through at least the bottom electrode 122 and the contact plug 112. For example, the bottom electrode 122 may comprise NiCr, Ru, Cu, Ta, TaN, Ti, TiN, or any combination thereof.

According to one embodiment, the MTJ stack 200 may comprise layered structure including, but not limited to, a reference layer 210, a tunnel barrier layer 220 stacked directly on the reference layer 210, and a free layer (or storage layer) 230 stacked directly on the tunnel barrier layer 220. According to one embodiment, the reference layer 210 may comprise a pinned layer, an anti-ferromagnetic (AFM) layer, and a polarization enhancement layer (PEL), but is not limited thereto.

According to some embodiments, a seed layer may be interposed between the bottom electrode 122 and the reference layer 210. For example, the seed layer may comprise Pt, Ta, Ru, Cr, or combinations thereof, but is not limited thereto. In an embodiment, the seed layer may be grown on a bottom electrode with an amorphous Ta capping layer, but is not limited thereto.

According to some embodiments, the MTJ stack comprises a reference layer, a tunnel barrier layer on the reference layer, and a free layer on the tunnel barrier layer.

Figure 15:
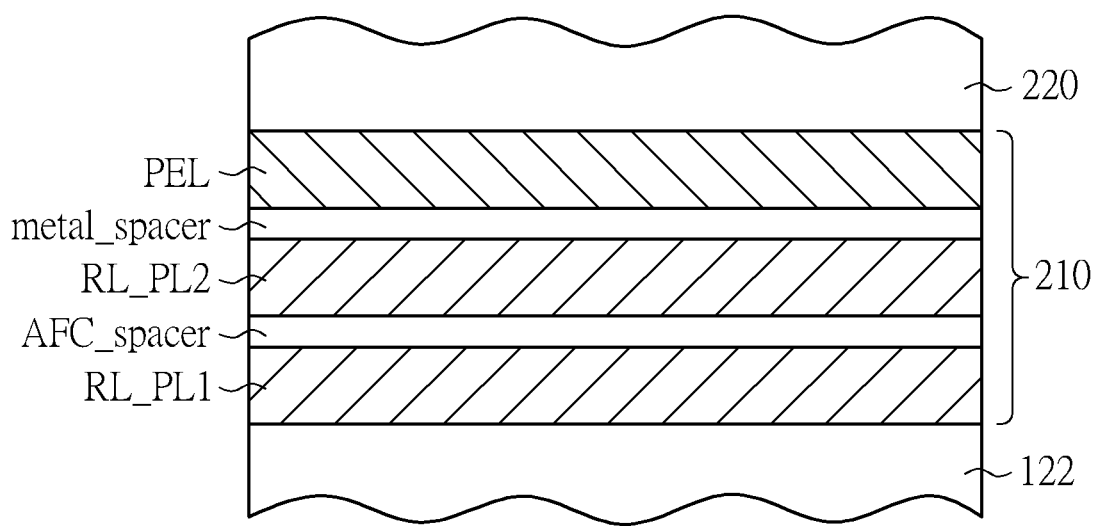
FIG. 15 is an enlarged sectional view of an exemplary reference layer of a MTJ stack according to a non-limiting embodiment of the present invention.

According to some embodiments, the reference layer 210 is comprised of RL_PL1|AFC-spacer|RL_PL2|metal-spacer|PEL, as shown in FIG. 15. RL_PL1 layer and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and RL_PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to some embodiments, the tunnel barrier layer 220 comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the free layer 230 is made of at least one of the following materials with thickness of 10 to 50 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, there is non-magnetic metal layer introduced in the free layer 230 to improve the retention. The non-magnetic metal layer comprises Ta, W, Mo, Nb, Mg, Al, C, V, Hf, Ir, Rh, Zr, Cr, Bi, or combinations thereof.

According to some embodiments, for example, the top electrode 322 may be made of ruthenium (Ru) having a hexagonal close packed (hcp) crystalline structure. The top electrode 322 also acts as an etching stopper, for example, during an ion beam etching process. The MTJ stack 200 is electrically connected to an overlying bit line 420 through the top electrode 322. A capping layer 240 may be interposed between the top electrode 322 and the free layer 230. The capping layer 240 is in direct contact with the free layer 230 and forms a first interface with the free layer 230. The capping layer 240 is in direct contact with the top electrode 322 and forms a second interface with the top electrode 322. The capping layer 240 may comprise MgO, AlOx, TiOx, HfOx, MgAlOx, MgZnOx, TaOx, VOx, or any combinations thereof. For example, the capping layer 240 may have a thickness of 5 to 30 angstroms.

Figure 2:
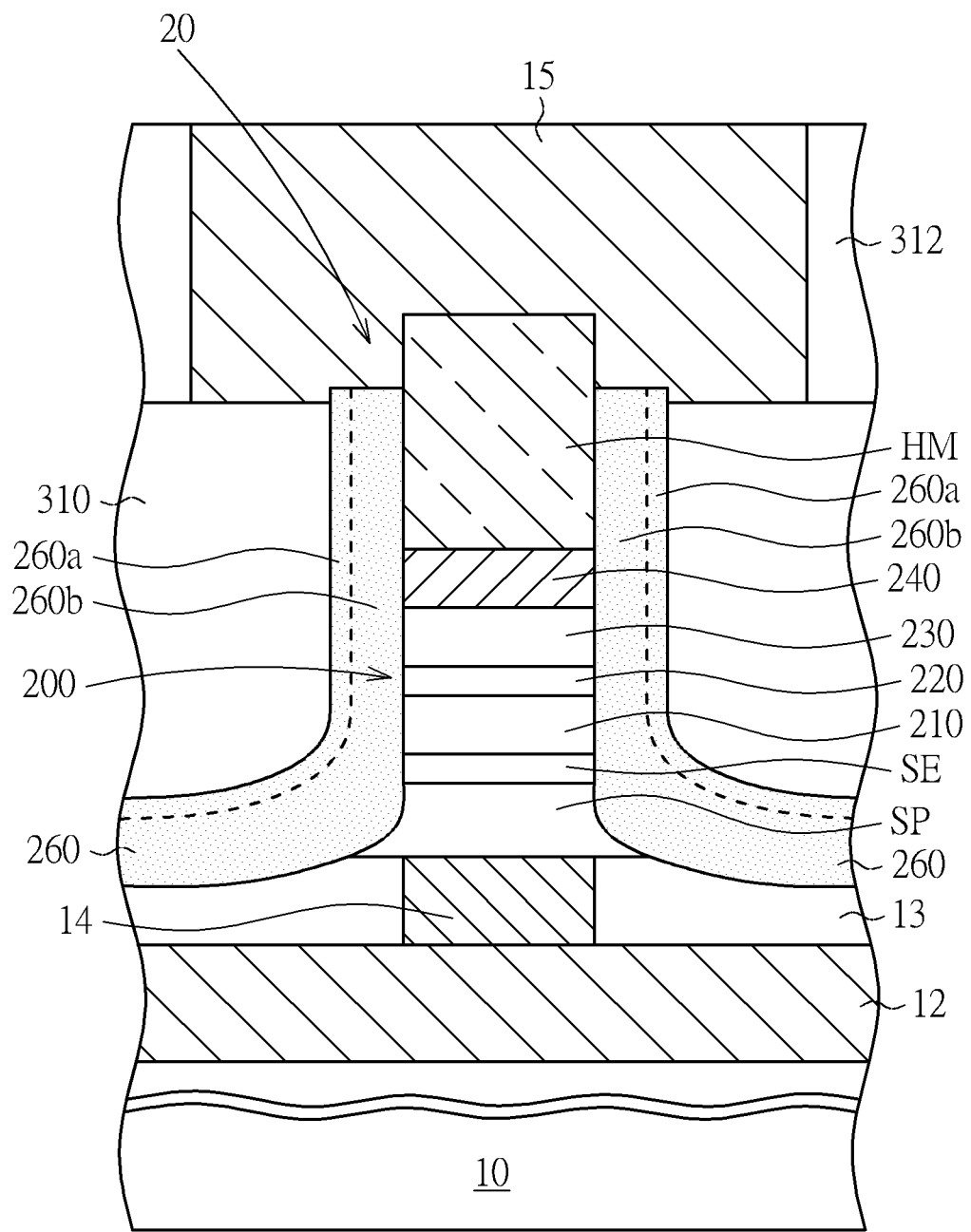
FIG. 2 is an enlarged, cross-sectional diagram showing a MTJ stack surrounded by an improved encapsulation layer according to one embodiment of the invention.

FIG. 2 is an enlarged, cross-sectional diagram showing a MTJ stack surrounded by an improved encapsulation layer according to one embodiment of the invention. As shown in FIG. 2, a cylindrical memory stack 20 is formed on a via 14 that is formed in an interlayer dielectric (ILD) layer 13. The via 14 may be electrically coupled to a metal interconnect 12 that is formed on a substrate 10. The cylindrical memory stack 20 may be formed on the via 14 and may comprise a magnetic tunneling junction (MTJ) stack 200. According to one embodiment, the MTJ stack 200 comprises a reference layer 210, a tunnel barrier layer 220 on the reference layer 210, and a free layer 230 on the tunnel barrier layer 220. According to one embodiment, a capping layer 240 may be formed on the free layer 230.

For example, as shown in FIG. 15, the reference layer 210 is comprised of RL_PL1|AFC-spacer|RL_PL2|metal-spacer|PEL, wherein RL_PL1 layer and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and RL_PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to some embodiments, the tunnel barrier layer 220 comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the free layer 230 is made of at least one of the following materials with thickness of 10 to 50 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, there is non-magnetic metal layer introduced in the free layer 230 to improve the retention. The non-magnetic metal layer comprises Ta, W, Mo, Nb, Mg, Al, C, V, Hf, Ir, Rh, Zr, Cr, Bi, or combinations thereof.

According to one embodiment, the capping layer 240 may comprise a combination of different functional layers including, for example, an amorphous layer, a light-element sink layer, and a diffusion-stop layer. The capping layer 240 is in direct contact with the free layer 230. According to one embodiment, for example, the amorphous layer may be made of metals having amorphous structure. For example, the amorphous layer may comprise a non-magnetic metal such as Ta, Ti or Al, a magnetic material such as CoFeB, FeB or CoB, or an oxide such as AlO, MgO, TaO$_2$ or RuO, but is not limited thereto. According to one embodiment, the light-element sink layer may be made of metals having ability of absorbing light elements such as B diffused from the free layer 230. For example, the light-element sink layer may comprise a non-magnetic metal such as Ta, Ti or Zr or a magnetic material such as Fe or its alloys, but is not limited thereto. According to one embodiment, the diffusion-stop layer may be made of materials that is capable of preventing elements from diffusing into the free layer at high temperature of above 400° C. For example, the diffusion-stop layer may comprise non-magnetic metals such as Ru, Mo, W or their alloys or oxides such as MgO, TaO, AlO, but is not limited thereto.

According to one embodiment, the cylindrical memory stack 20 may comprise a hard mask layer HM such as Ru, TiN, TaN or combinations thereof on the capping layer 240. The hard mask layer HM may function as a top electrode. A spacer layer SP may be disposed on the ILD layer 13 and the via 14. For example, the spacer layer SP may comprise a non-magnetic material including but not limited to one of TiN, TaN, Ta, or Ti. A seed layer SE may be disposed on the spacer layer SP. The seed layer SE may be a layer of NiCr, NiFe, Pt, Ru, or NiFeCr, for example. A damascened copper interconnect 15 in the overlying ILD layer 312 is in direct contact with the hard mask layer HM. An encapsulation layer 260 is disposed around the cylindrical memory stack 20 on the ILD layer 13. The encapsulation layer 260 protects the sidewall of the MTJ stack 200.

According to one embodiment, the encapsulation layer 260 comprises an outer silicon oxynitride layer 260a with a composition of $SiO_{x1}N_{y1}$ and an inner silicon oxynitride layer 260b with a composition of $SiO_{x2}N_{y2}$, wherein x1/y1>x2/y2. The inner silicon oxynitride layer 260b is in direct contact with the sidewall of the MTJ stack 200. The oxygen concentration in the encapsulation layer 260 gradually decreases from the outer silicon oxynitride layer 260a to the inner silicon oxynitride layer 260b and a gradient oxygen concentration across the thickness of the encapsulation layer 260 is formed. The gradient oxygen concentration across the thickness of the encapsulation layer 260 can reduce the possibility of that the oxygen reacts with the sidewall of MTJ stack 200.

Figure 3:
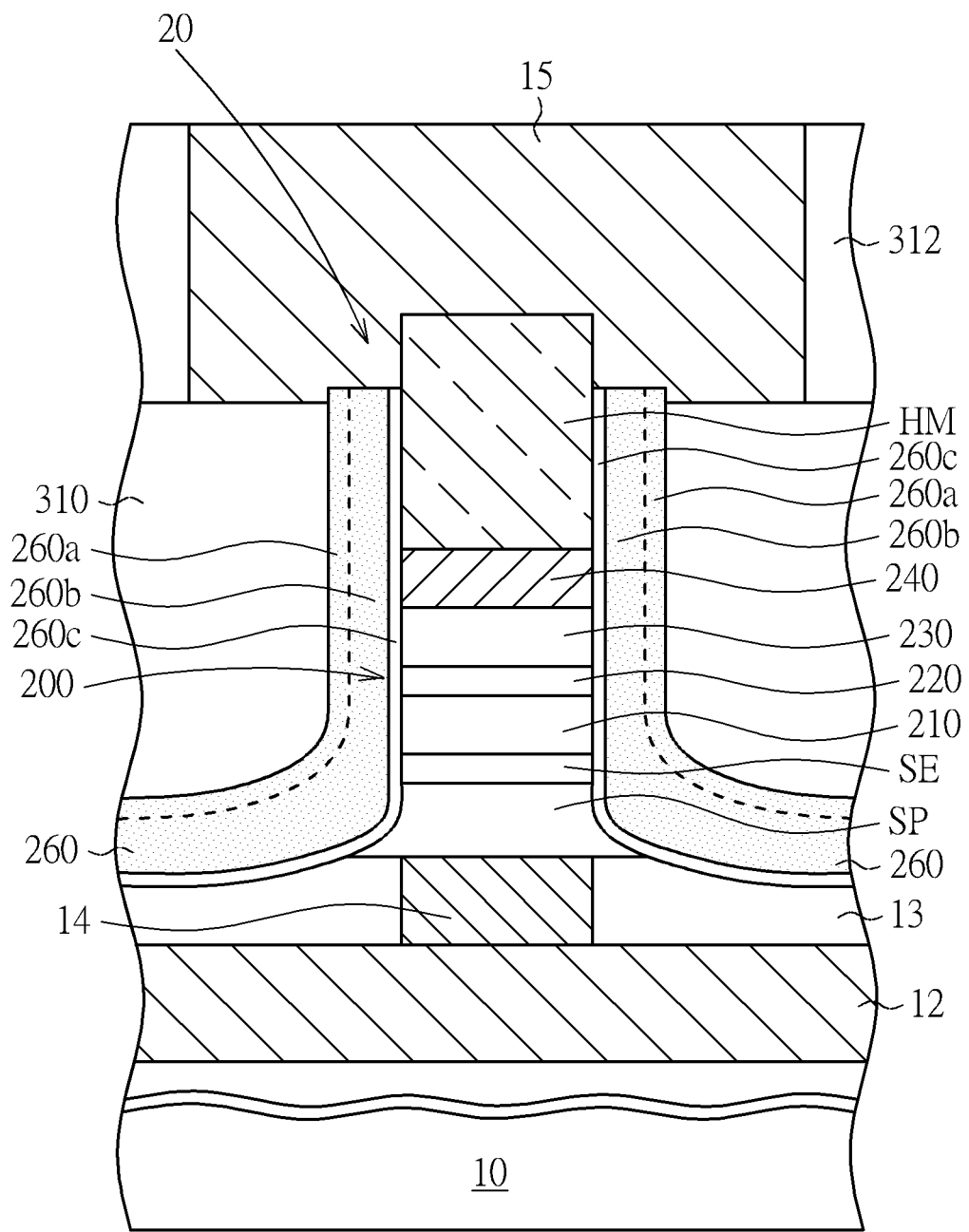
FIG. 3 is an enlarged, cross-sectional diagram showing a MTJ stack surrounded by an improved encapsulation layer according to another embodiment of the invention.

FIG. 3 is an enlarged, cross-sectional diagram showing a MTJ stack surrounded by an improved encapsulation layer according to another embodiment of the invention, wherein like layers, regions or elements are designated by like numeral numbers or labels As shown in FIG. 3, likewise, the encapsulation layer 260 comprises an outer silicon oxynitride layer 260a with a composition of $SiO_{x1}N_{y1}$ and an inner silicon oxynitride layer 260b with a composition of $SiO_{x2}N_{y2}$, wherein x1/y1>x2/y2. The oxygen concentration in the encapsulation layer 260 gradually decreases from the outer silicon oxynitride layer 260a to the inner silicon oxynitride layer 260b and a gradient oxygen concentration across the thickness of the encapsulation layer 260 is formed. One difference between the memory structure in FIG. 2 and the memory structure in FIG. 3 is that the encapsulation layer 260 comprises a thin silicon nitride layer 260c between the inner silicon oxynitride layer 260b and the sidewall of the MTJ stack 200.

FIG. 4 to FIG. 14 are schematic, cross-sectional diagrams showing an exemplary method for fabricating the MTJ stack surrounded by an improved encapsulation layer in FIG. 2 according to one embodiment of the invention, wherein like layers, regions or elements are designated by like numeral numbers or labels.

Figure 4:
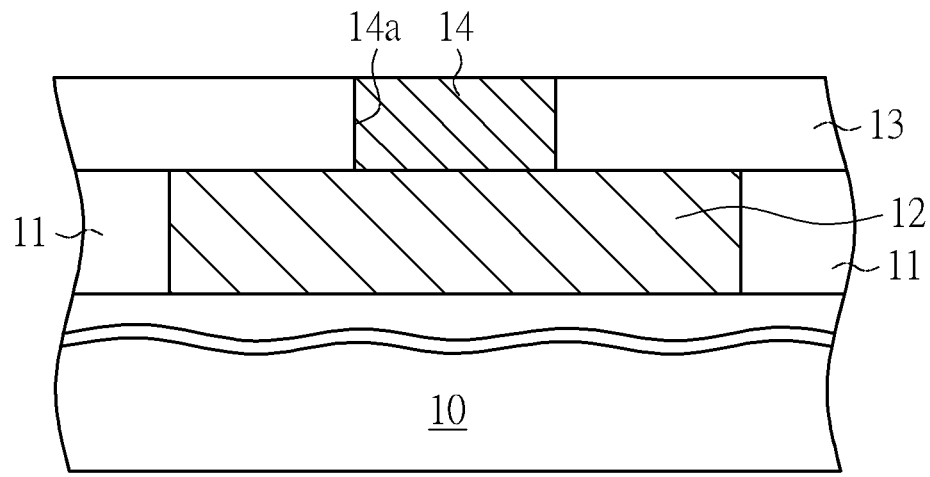
FIG. 4 to FIG. 14 are cross-sectional diagrams showing an exemplary method for fabricating the MTJ stack with the capping layer according to one embodiment of the invention.

As shown in FIG. 4, a substrate 10 is provided. For example, the substrate 10 may be a silicon substrate or any suitable semiconductor substrates known in the art. For the sake of simplicity, only the region for forming the cylindrical memory stack is shown through FIG. 4 to FIG. 14. It is understood that peripheral circuits for supporting the MRAM memory array may be formed on the substrate 10. The peripheral circuits may be formed in a logic circuit area, which is not shown through FIG. 4 to FIG. 14. The access transistor as depicted in FIG. 1 is also omitted through FIG. 4 to FIG. 14 for the sake of simplicity.

According to one embodiment, a metal interconnect 12 such as a copper metal line may be formed in an ILD layer 11 on the substrate 10. The metal interconnect 12 may be electrically connected to a terminal of a transistor (not shown) that is fabricated on the substrate 10. Another ILD layer 13 may be deposited on the metal interconnect 12. The ILD layers 11 and 13 may comprise ultra-low k dielectric materials that have a dielectric constant (k) lower than 2.5. For example, the ILD layers 11 and 13 may comprise carbon-doped oxide (CDO) or SiCOH, but is not limited thereto.

A lithographic process and an etching process may be carried out to form a via hole 14a in the ILD layer 13. The via hole 14a is situated directly above the metal interconnect 12. Subsequently, a metal fill process is performed to fill the via hole 14a with meal such as W, Cu, Ta, or TaN, which is then polished by chemical mechanical polishing (CMP) to thereby form a via 14 in the via hole 14a. The via 14 may function as a bottom electrode.

Figure 5:
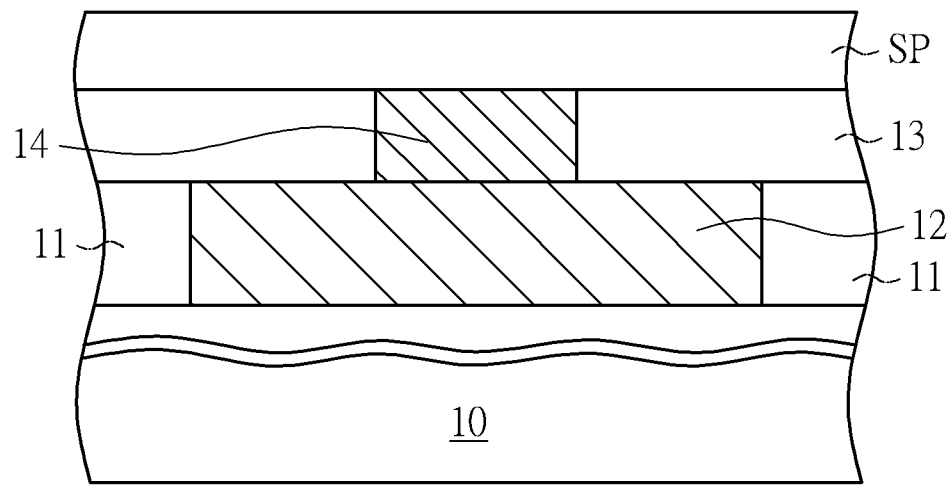

As shown in FIG. 5, subsequently, a spacer layer SP may be deposited on the ILD layer 13 and the via 14. For example, the spacer layer SP may comprise a non-magnetic material including but not limited to one of TiN, TaN, Ta, or Ti. After the deposition of the spacer layer, a CMP process may be performed to polish the top surface of the spacer layer SP.

Figure 6:
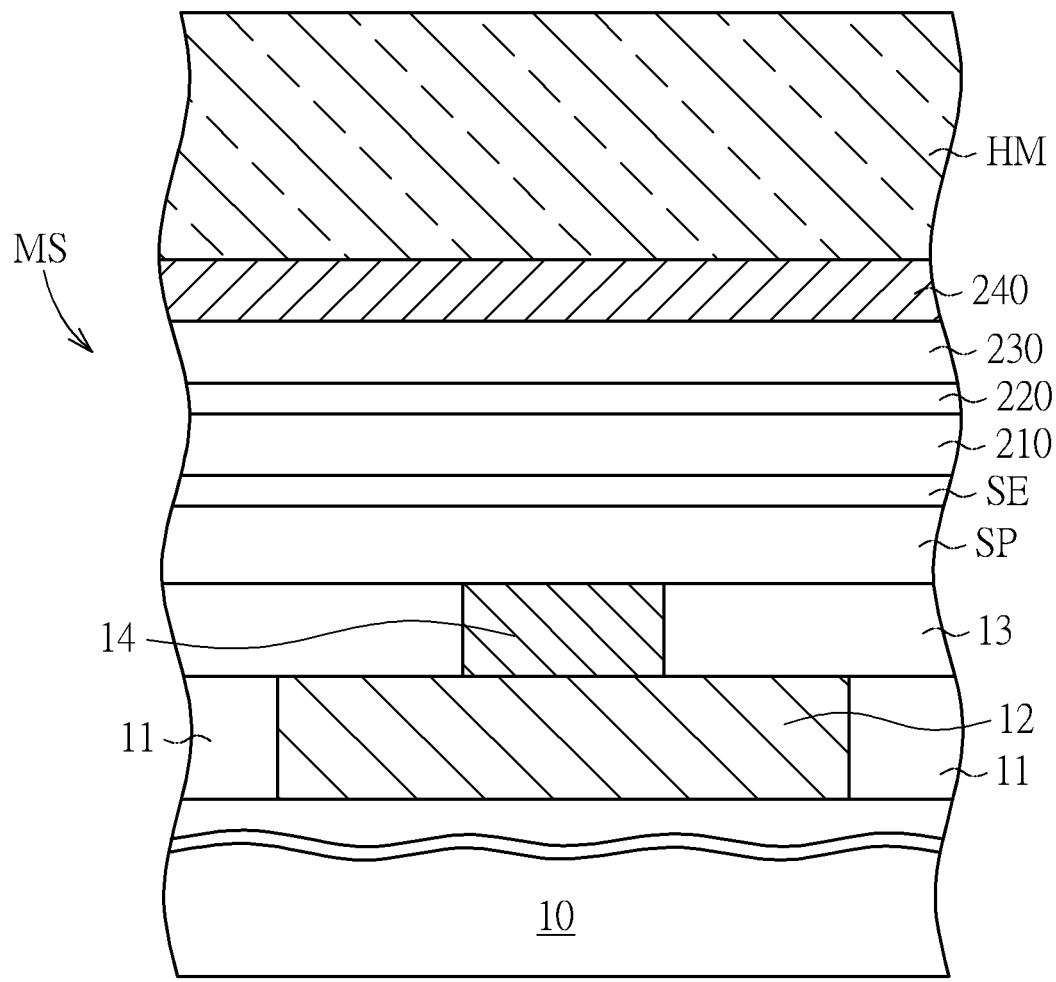

As shown in FIG. 6, subsequently, a film stack MS is fabricated on the spacer layer SP by sequentially forming a seed layer SE, a reference layer 210, a tunnel barrier layer 220, a free layer 230, and a capping layer 240. The seed layer SE may be a layer of NiCr, NiFe, Pt, Ru, or NiFeCr, for example. In one embodiment, the seed layer SE may be grown on a bottom conductor with an amorphous Ta capping layer, but is not limited thereto. After forming the capping layer 240, a hard mask layer HM such as Ru, TiN, TaN or combinations thereof is deposited on the capping layer 240. The hard mask layer HM also functions as a top electrode.

For example, as shown in FIG. 15, the reference layer 210 is comprised of RL_PL1|AFC-spacer|RL_PL2|metal-spacer|PEL, wherein RL_PL1 layer and RL_PL2 layer are ferromagnetic layers having strong perpendicular magnetic anisotropy, which may be made of [Co/Pt]n, [Co/Pd]n, [Co/Ni]n multilayers, [Co/Ir]n and [Fe/Rh]n; FePt, CoPt, FePd, TeFeCo, GdCo, MnGa, MnGe, MnSi, alloys thereof, or any combination thereof. The RL_PL layer may have a thickness of about 10 to 50 angstroms. Metal-spacer comprises metal having amorphous texture, which provides PMA of PEL and also supplies a strong exchange coupling between PEL and RL_PL. Metal-spacer may be made of Ta, Mo, W, Ir, Rh, Zr, Nb, Hf, Cr, V, Bi or any combination thereof, having a thickness of 0.5 to 5 angstroms. PEL is ferromagnet having high spin polarization and acquiring PMA at the interface of Metal-spacer and tunnel barrier. PEL may be made of Fe, Co, Ni, Mn magnetic elements and B, Al, Si, non-magnetic elements, such as CoFeB, CoFeAl, and CoMnSi. The thickness of PEL is about 4 to 15 angstroms. AFC-spacer is metal that provides antiferromagnetic coupling between RL_PL and PEL, made of Ru, Ir, Rh, Cr and Re. The thickness of AFC-spacer is about 2 to 15 angstroms.

According to some embodiments, the tunnel barrier layer 220 comprises MgO. The tunnel barrier layer is not limited to MgO. The tunnel barrier layer may comprise AlOx, TiOx, HfOx, MgAlOx, MgZnOx, TaOx, VOx, or any combination thereof. The tunnel barrier layer may have a thickness of 5 to 30 angstroms.

According to some embodiments, the free layer 230 is made of at least one of the following materials with thickness of 10 to 50 angstroms: Fe, CoFe, CoFeB, CoFeAl, CoMnSi, CoPt, FePt, CoPd, FePd, TeFeCo, GdCo, MnGa, MnGe, MnAl, MnSi or combinations thereof.

According to some embodiments, there is non-magnetic metal layer introduced in the free layer 230 to improve the retention. The non-magnetic metal layer comprises Ta, W, Mo, Nb, Mg, Al, C, V, Hf, Ir, Rh, Zr, Cr, Bi, or combinations thereof.

According to one embodiment, the capping layer 240 may comprise a combination of different functional layers including, for example, an amorphous layer, a light-element sink layer, and a diffusion-stop layer. The capping layer 240 is in direct contact with the free layer 230. According to one embodiment, for example, the amorphous layer may be made of metals having amorphous structure. For example, the amorphous layer may comprise a non-magnetic metal such as Ta, Ti or Al, a magnetic material such as CoFeB, FeB or CoB, or an oxide such as AlO, MgO, $TaO_2$ or RuO, but is not limited thereto. According to one embodiment, the light-element sink layer may be made of metals having ability of absorbing light elements such as B diffused from the free layer 230. For example, the light-element sink layer may comprise a non-magnetic metal such as Ta, Ti or Zr or a magnetic material such as Fe or its alloys, but is not limited thereto. According to one embodiment, the diffusion-stop layer may be made of materials that is capable of preventing elements from diffusing into the free layer at high temperature of above 400° C. For example, the diffusion-stop layer may comprise non-magnetic metals such as Ru, Mo, W or their alloys or oxides such as MgO, TaO, AlO, but is not limited thereto.

Figure 7:
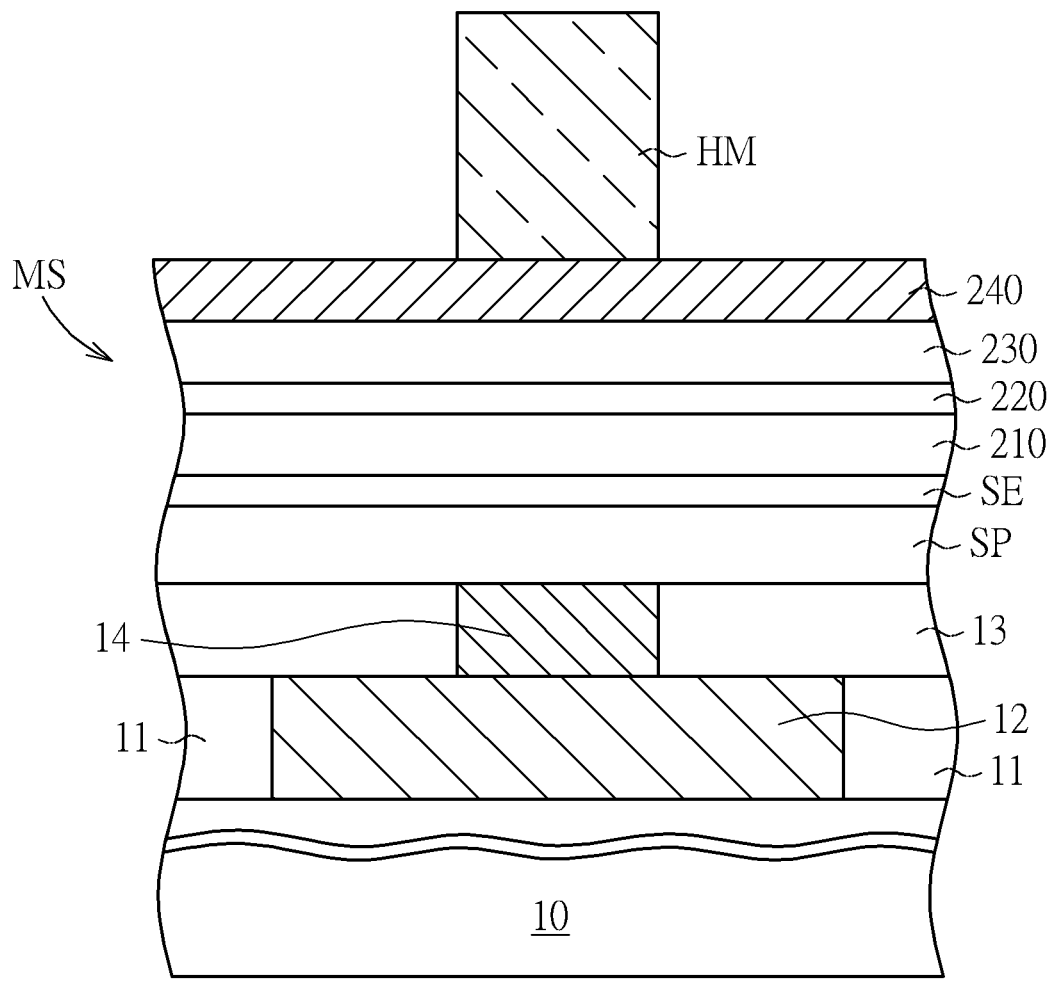

As shown in FIG. 7, a lithographic process and an etching process may be performed to pattern the hard mask layer HM. The patterned hard mask HM acts as an etch stopper in the subsequent etching process such as ion beam etching (IBE) or reactive ion etching (RIE).

Figure 8:
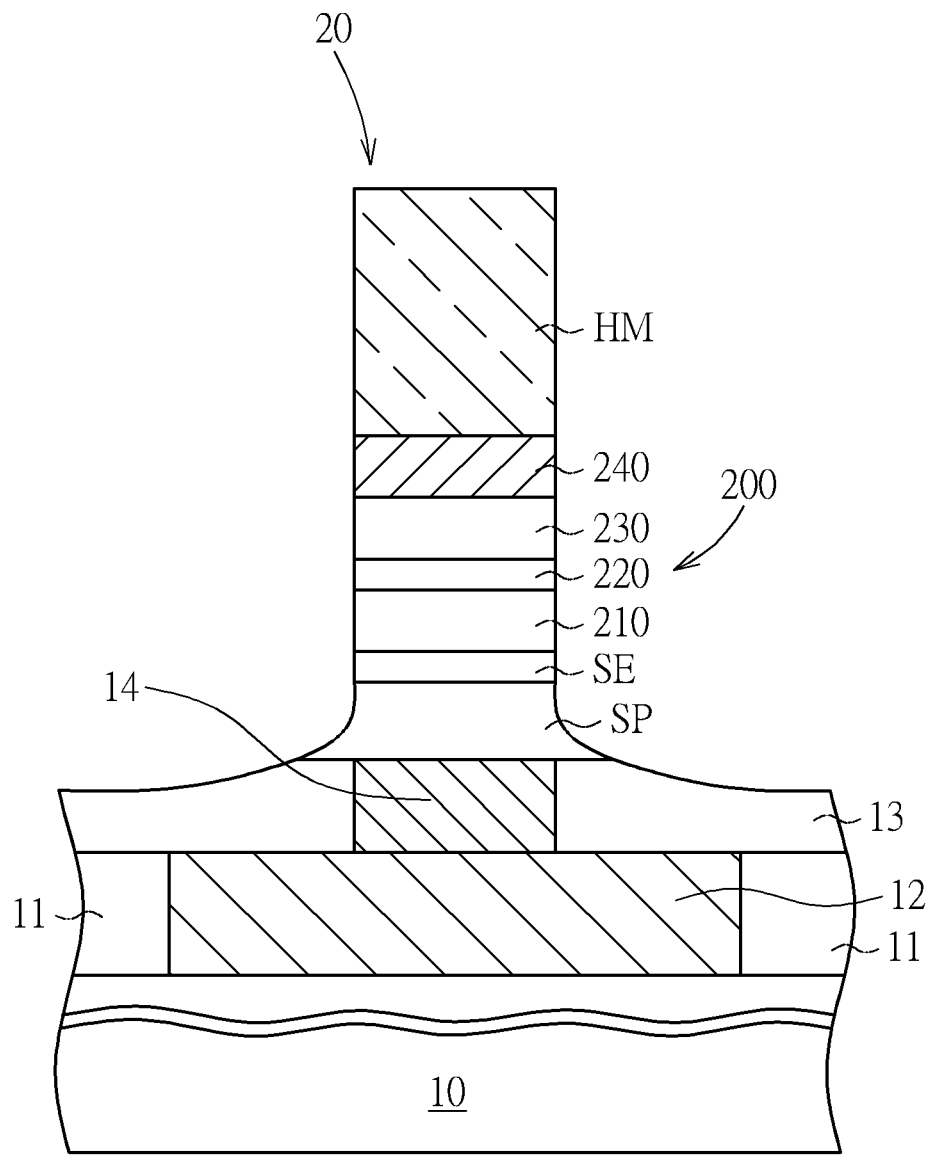

As shown in FIG. 8, an ion beam etching (IBE) or reactive ion etching (RIE) process is carried out to etch the capping layer 240, the free layer 230, the tunnel barrier layer 220, the reference layer 210, the seed layer SE, and the spacer layer SP, thereby forming a cylindrical memory stack 20. At this point, a sidewall of the MTJ stack 200 is exposed. According to some embodiments, an upper portion of the ILD layer 13 may be etched away, thereby forming a tapered top surface profile.

Figure 9:
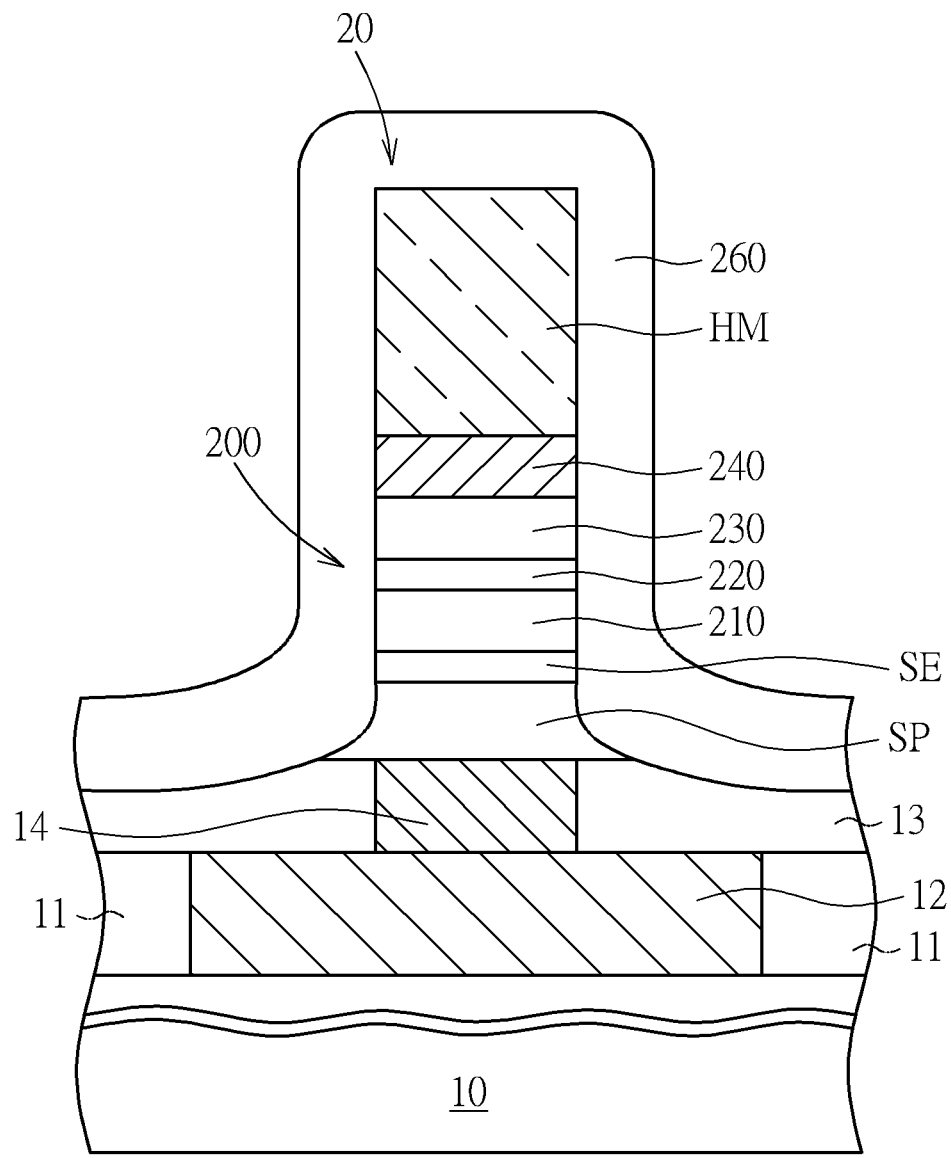

Subsequently, as shown in FIG. 9, an encapsulation layer 260 is conformally deposited on the cylindrical memory stack 20 and on the ILD layer 13. According to one embodiment, the encapsulation layer 260 is formed by depositing a silicon-rich SiN layer. The encapsulation layer 260 may be deposited by chemical vapor deposition (CVD), atomic layer deposition (ALD), or physical vapor deposition (PVD) methods, but is not limited thereto. The encapsulation layer 260 protects the sidewalls of the cylindrical memory stack 20, especially, the sidewall of the MTJ stack 200. According to one embodiment, the Si content of the aforesaid silicon-rich SiN layer exceeds that of the stoichiometric $Si_3N_4$, i.e., Si:N>0.75:1. By using the silicon-rich SiN layer, the nitrogen damage to the sidewall of the MTJ stack 200 during the deposition of the encapsulation layer 260 can be alleviated or avoided.

Figure 10:
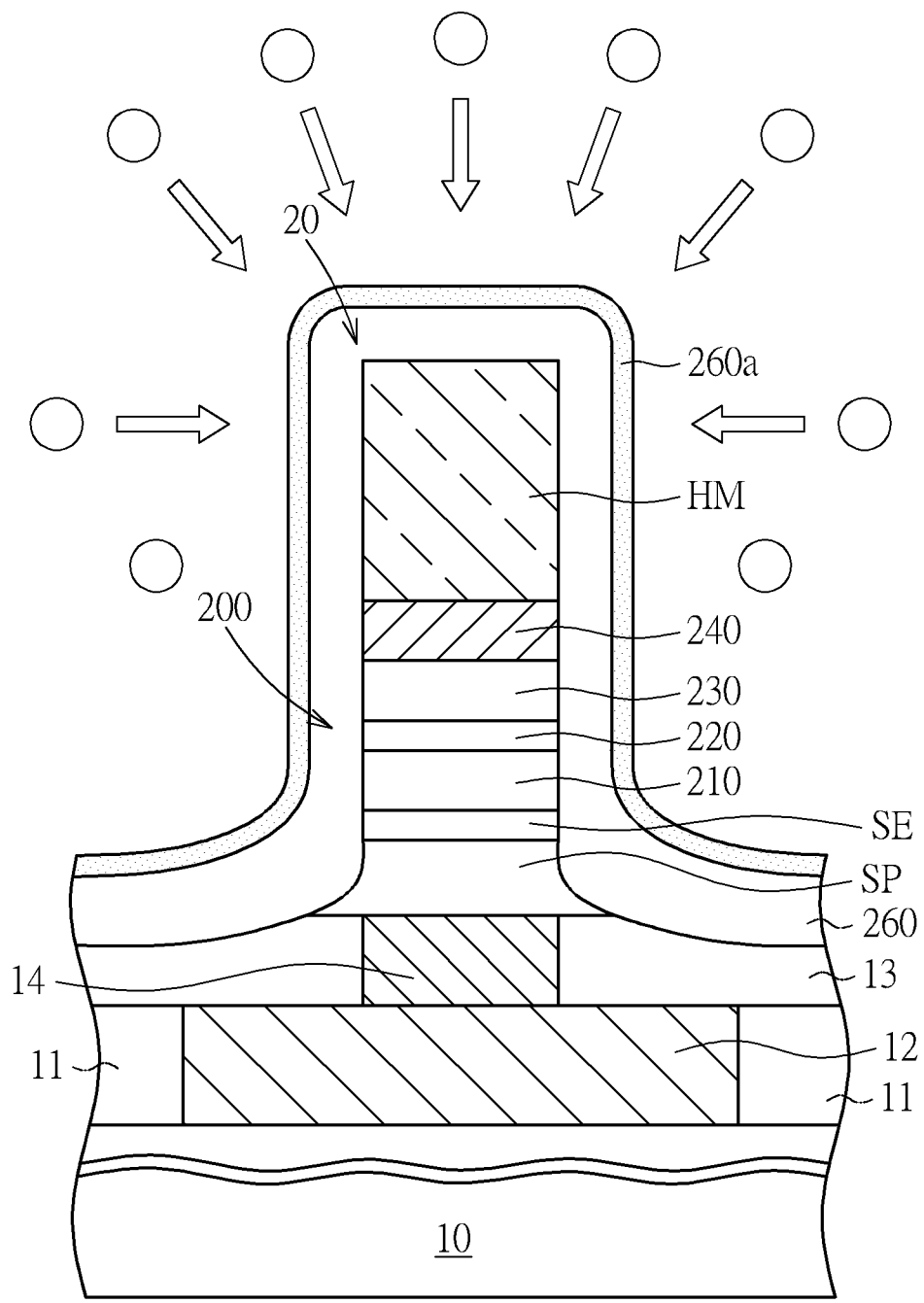

As shown in FIG. 10, the encapsulation layer 260 is then subjected to a post-treatment 500 such as an in-situ oxygen plasma treatment. The surface of the encapsulation layer 260 contacts the oxygen plasma, thereby transforming the outer portion of the encapsulation layer 260 into an outer silicon oxynitride layer 260a, while the rest part (or inner part) of the encapsulation layer 260 is still the originally-deposited silicon-rich SiN layer.

According to another embodiment, the outer silicon oxynitride layer 260a may be formed by subjecting the encapsulation layer 260 to air or oxygen gas with room temperature or elevated substrate temperatures. According to another embodiment, the outer silicon oxynitride layer 260a may be deposited by CVD, ALD or PVD methods. According to still another embodiment, optionally, after forming the outer silicon oxynitride layer 260a, an additional dielectric layer such as silicon oxynitride layer, silicon nitride layer or silicon oxide layer may be conformally deposited on the outer silicon oxynitride layer 260a by CVD, ALD or PVD methods.

Figure 11:
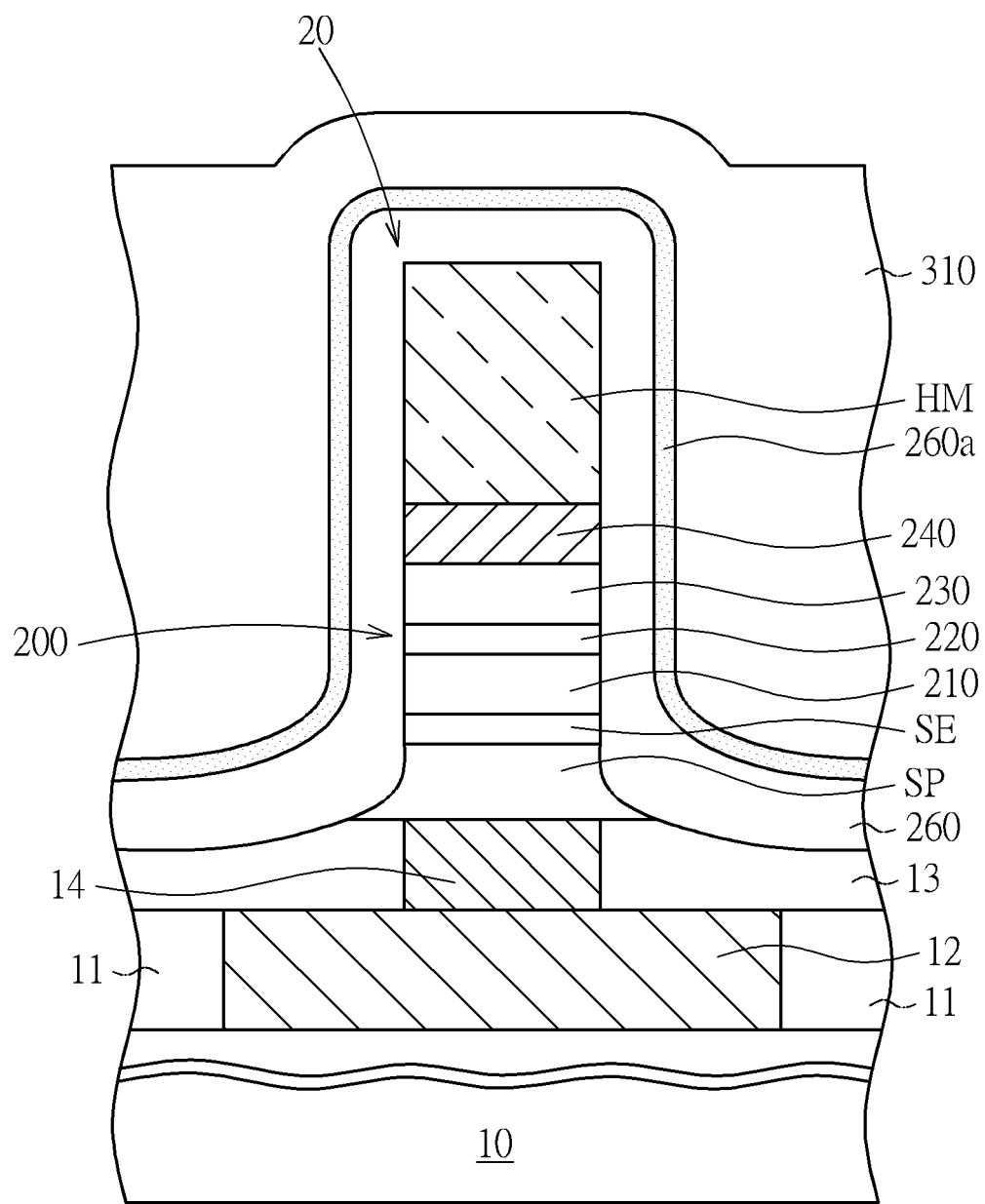

Subsequently, as shown in FIG. 11, an ILD layer 310 is deposited on the encapsulation layer 260. According to one embodiment, the ILD layer 310 may comprise SiN, SiCN, SiCNO or ULK materials known in the art. According to one embodiment, optionally, the ILD layer 310 may be subjected to a CMP process to form a planarized surface.

Figure 12:
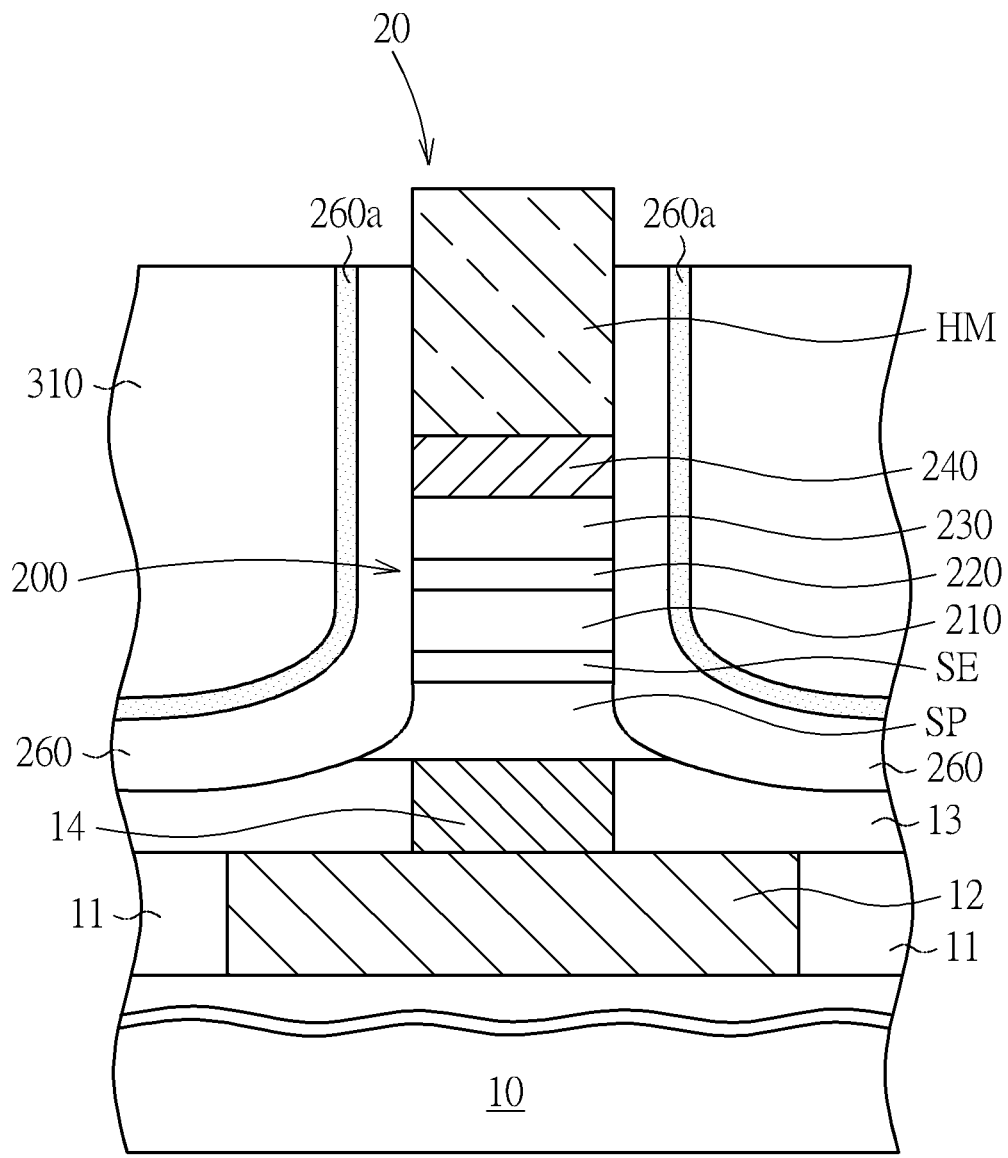

As shown in FIG. 12, an etching back process is then performed to etch the ILD layer 310 and the encapsulation layer 260 until the upper portion of the hard mask layer HM is exposed for further connection to a top copper interconnect.

Figure 13:
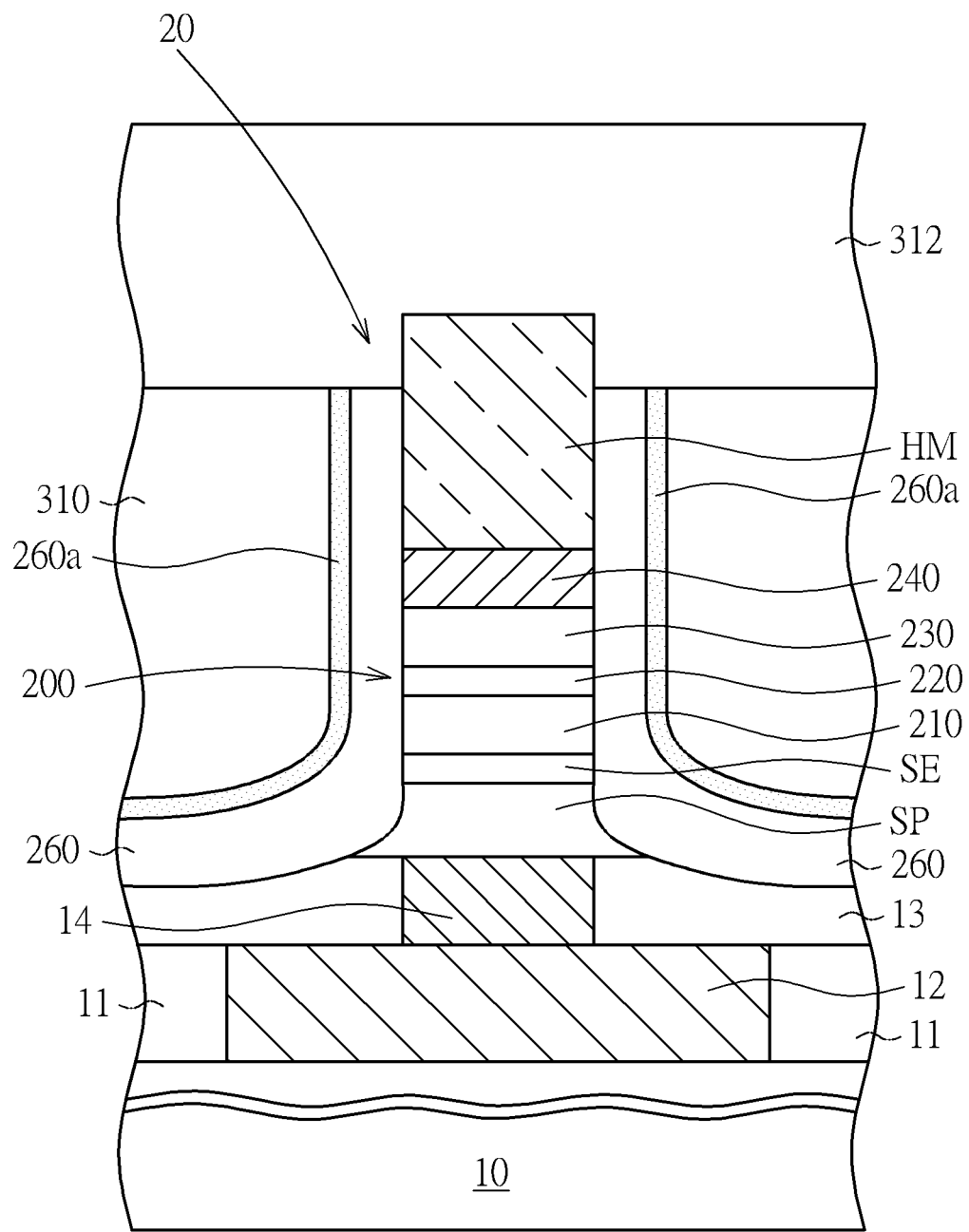

As shown in FIG. 13, an ILD layer 312 is deposited on the encapsulation layer 260, the ILD layer 310 and the exposed hard mask layer HM. According to one embodiment, the ILD layer 312 may comprise SiN, SiCN, SiCNO or ULK materials known in the art.

Figure 14:
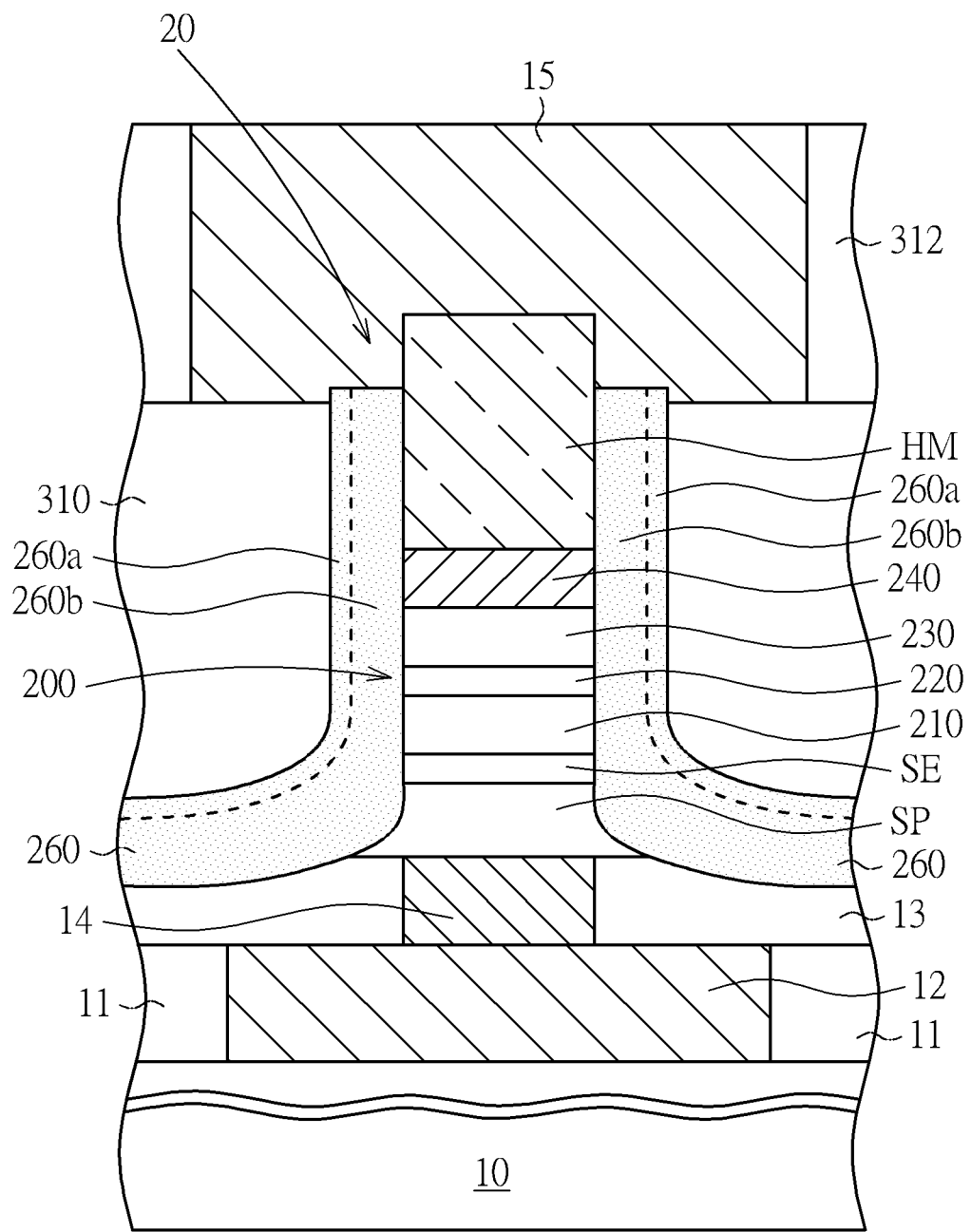

As shown in FIG. 14, a back-end of line (BEOL) process such as copper damascene process may be performed to form a damascened copper interconnect 15 directly on the hard mask layer HM. According to one embodiment, the damascened copper interconnect 15 is in direct contact with the hard mask layer HM. According to one embodiment, the damascened copper interconnect 15 is in direct contact with the encapsulation layer 260. According to one embodiment, the damascened copper interconnect 15 is in direct contact with the ILD layer 310. According to one embodiment, the damascened copper interconnect 15 may be electrically connected to a bit line (not shown).

During the thermal effect of BEOL process, the rest part of the encapsulation layer 260 underneath the outer silicon oxynitride layer 260a is transformed into an inner silicon oxynitride layer 260b. According to another embodiment, the outer silicon oxynitride layer 260a may have a composition of $SiO_{x1}N_{y1}$. According to another embodiment, the inner silicon oxynitride layer 260b may have a composition of $SiO_{x2}N_{y2}$, wherein x1/y1>x2/y2. The oxygen concentration in the encapsulation layer 260 gradually decreases from the outer silicon oxynitride layer 260a to the inner silicon oxynitride layer 260b and a gradient oxygen concentration across the thickness of the encapsulation layer 260 is formed.

It is advantageous to use the present invention because the encapsulation layer 260 is a silicon-rich SiN layer and the potential nitrogen damage to the magnetic layer and the MgO layer during the deposition of the encapsulation layer 260 can be reduced. The encapsulation layer 260 of the final product has an outer silicon oxynitride layer 260a with a composition of $SiO_{x1}N_{y1}$ and an inner silicon oxynitride layer 260b with a composition of $SiO_{x2}N_{y2}$, wherein x1/y1>x2/y2. The gradient oxygen concentration across the thickness of the encapsulation layer 260 can reduce the possibility of that the oxygen reacts with the sidewall of MTJ stack 200. The encapsulation layer 260 comprises amorphous silicon oxynitride and therefore has improved ability to block the diffusion of undesired species such as boron. Further, it has been experimentally affirmed that the MR ratio and the He/Vc of the MRAM device with the disclosed encapsulation layer structure can both be improved.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor memory structure, comprising:
a substrate;
a magnetic tunneling junction (MTJ) stack disposed on the substrate; and
an encapsulation layer surrounding the MTJ stack, wherein the encapsulation layer comprises an outer silicon oxynitride layer with a composition of $SiO_{x1}N_{y1}$ and an inner silicon oxynitride layer with a composition of $SiO_{x2}N_{y2}$, wherein $x1/y1 > x2/y2$.

2. The semiconductor memory structure according to claim 1, wherein the MTJ stack comprises a reference layer, a tunnel barrier layer on the reference layer, and a free layer on the tunnel barrier layer.

3. The semiconductor memory structure according to claim 2, wherein the tunnel barrier layer comprises MgO, $AlO_x$, $TiO_x$, $HfO_x$, $MgAlO_x$, $MgZnO_x$, $TaO_x$, $VO_x$, or any combination thereof.

4. The semiconductor memory structure according to claim 2, wherein the free layer comprises Fe, CoFe, CoFeB, CoFeAl, CoMnSi, CoPt, FePt, CoPd, FePd, TeFeCo, GdCo, MnGa, MnGe, MnAl, MnSi or combinations thereof, with a thickness of 10 to 50 angstroms, wherein the free layer comprises non-magnetic metal layer, and wherein the non-magnetic metal layer comprises Ta, W, Mo, Nb, Mg, Al, C, V, Hf, Ir, Rh, Zr, Cr, Bi, or combinations thereof.

5. The semiconductor memory structure according to claim 2 further comprising a capping layer on the free layer.

6. The semiconductor memory structure according to claim 5, wherein the capping layer comprises an amorphous layer, a light-element sink layer, and a diffusion-stop layer.

7. The semiconductor memory structure according to claim 5 further comprising a hard mask layer on the capping layer.

8. The semiconductor memory structure according to claim 7, wherein the hard mask layer comprises Ru, TiN, TaN or combinations thereof and functions as a top electrode.

9. The semiconductor memory structure according to claim 1, wherein the inner silicon oxynitride layer is in direct contact with a sidewall of the MTJ stack.

10. A method for fabricating a semiconductor memory structure, comprising:
providing a substrate;
forming a magnetic tunneling junction (MTJ) stack on the substrate; and
forming an encapsulation layer surrounding the MTJ stack, wherein the encapsulation layer comprises an outer silicon oxynitride layer with a composition of $SiO_{x1}N_{y1}$ and an inner silicon oxynitride layer with a composition of $SiO_{x2}N_{y2}$, wherein $x1/y1 > x2/y2$.

11. The method according to claim 10, wherein said forming the MTJ stack comprises:
forming a reference layer on the substrate;
forming a tunnel barrier layer on the reference layer; and
forming a free layer on the tunnel barrier layer.

12. The semiconductor memory structure according to claim 11, wherein the tunnel barrier layer comprises MgO, $AlO_x$, $TiO_x$, $HfO_x$, $MgAlO_x$, $MgZnO_x$, $TaO_x$, $VO_x$, or any combination thereof.

13. The semiconductor memory structure according to claim 11, wherein the free layer comprises Fe, CoFe, CoFeB, CoFeAl, CoMnSi, CoPt, FePt, CoPd, FePd, TeFeCo, GdCo, MnGa, MnGe, MnAl, MnSi or combinations thereof, with a thickness of 10 to 50 angstroms, wherein the free layer comprises non-magnetic metal layer, and wherein the non-magnetic metal layer comprises Ta, W, Mo, Nb, Mg, Al, C, V, Hf, Ir, Rh, Zr, Cr, Bi, or combinations thereof.

14. The method according to claim 11 further comprising:
forming a capping layer on the free layer.

15. The method according to claim 14 further comprising:
forming a hard mask layer on the capping layer.

16. The method according to claim 10, wherein forming encapsulation layer surrounding the MTJ stack comprises:
depositing a silicon-rich SiN layer on a sidewall of the MTJ stack; and
subjecting the silicon-rich SiN layer to a post-treatment, thereby transforming an outer portion of the encapsulation layer into the outer silicon oxynitride layer, while an inner part of the encapsulation layer is still the silicon-rich SiN layer.

17. The method according to claim 16, wherein a Si content of the silicon-rich SiN layer exceeds that of stoichiometric $Si_3N_4$.

18. The method according to claim 16, wherein the post-treatment comprises an oxygen plasma treatment.

* * * * *